(12) United States Patent
Wu et al.

(10) Patent No.: US 11,302,784 B2
(45) Date of Patent: Apr. 12, 2022

(54) SEMICONDUCTOR DEVICE HAVING CONTACT FEATURE AND METHOD OF FABRICATING THE SAME

(71) Applicant: Taiwan Semiconductor Manufacturing Co., Ltd., Hsin-Chu (TW)

(72) Inventors: Xusheng Wu, Hsinchu (TW); Chang-Miao Liu, Hsinchu (TW); Ying-Keung Leung, Hsinchu (TW); Huiling Shang, Hsinchu County (TW); Youbo Lin, Ridgefield, CT (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/746,618

(22) Filed: Jan. 17, 2020

(65) Prior Publication Data

US 2021/0226018 A1  Jul. 22, 2021

(51) Int. Cl.
| | | |
|---|---|---|
| *H01L 29/40* | (2006.01) | |
| *H01L 21/768* | (2006.01) | |
| *H01L 21/283* | (2006.01) | |
| *H01L 29/45* | (2006.01) | |
| *H01L 21/285* | (2006.01) | |
| *H01L 29/66* | (2006.01) | |

(52) U.S. Cl.
CPC .......... *H01L 29/401* (2013.01); *H01L 21/283* (2013.01); *H01L 21/28518* (2013.01); *H01L 21/76802* (2013.01); *H01L 21/76831* (2013.01); *H01L 21/76877* (2013.01); *H01L 29/456* (2013.01); *H01L 29/665* (2013.01)

(58) Field of Classification Search
CPC ................. H01L 29/665; H01L 21/28518
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2016/0020301 A1* | 1/2016 | Park ..................... H01L 27/0924 257/283 |
| 2016/0163702 A1* | 6/2016 | Wu ................... H01L 29/66628 257/369 |
| 2020/0381516 A1* | 12/2020 | Zhaomeng .......... H01L 29/6656 |

* cited by examiner

*Primary Examiner* — Farun Lu

(74) *Attorney, Agent, or Firm* — Haynes and Boone, LLP

(57) ABSTRACT

A method including providing a device including a gate structure and a source/drain feature adjacent to the gate structure. An insulating layer (e.g., CESL, ILD) is formed over the source/drain feature. A trench is etched in the insulating layer to expose a surface of the source/drain feature. A semiconductor material is then formed in the etched trench on the surface of the source/drain feature. The semiconductor material is converted to a silicide.

20 Claims, 14 Drawing Sheets

SEMICONDUCTOR DEVICE HAVING CONTACT FEATURE AND METHOD OF FABRICATING THE SAME

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

For example, fabrication of vertical interconnects becomes more challenging as feature sizes continue to decrease. For example, forming contacts to transistor features such as source, drain, or gate may be difficult to achieve without impacting contact resistance and/or series resistance of the device. In particular, as devices are scaled, the total on-scaled resistance may be determined in large part by the series resistance in forming vertical contacts to the transistor features. Thus, the current devices and methods of forming thereof may not be satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
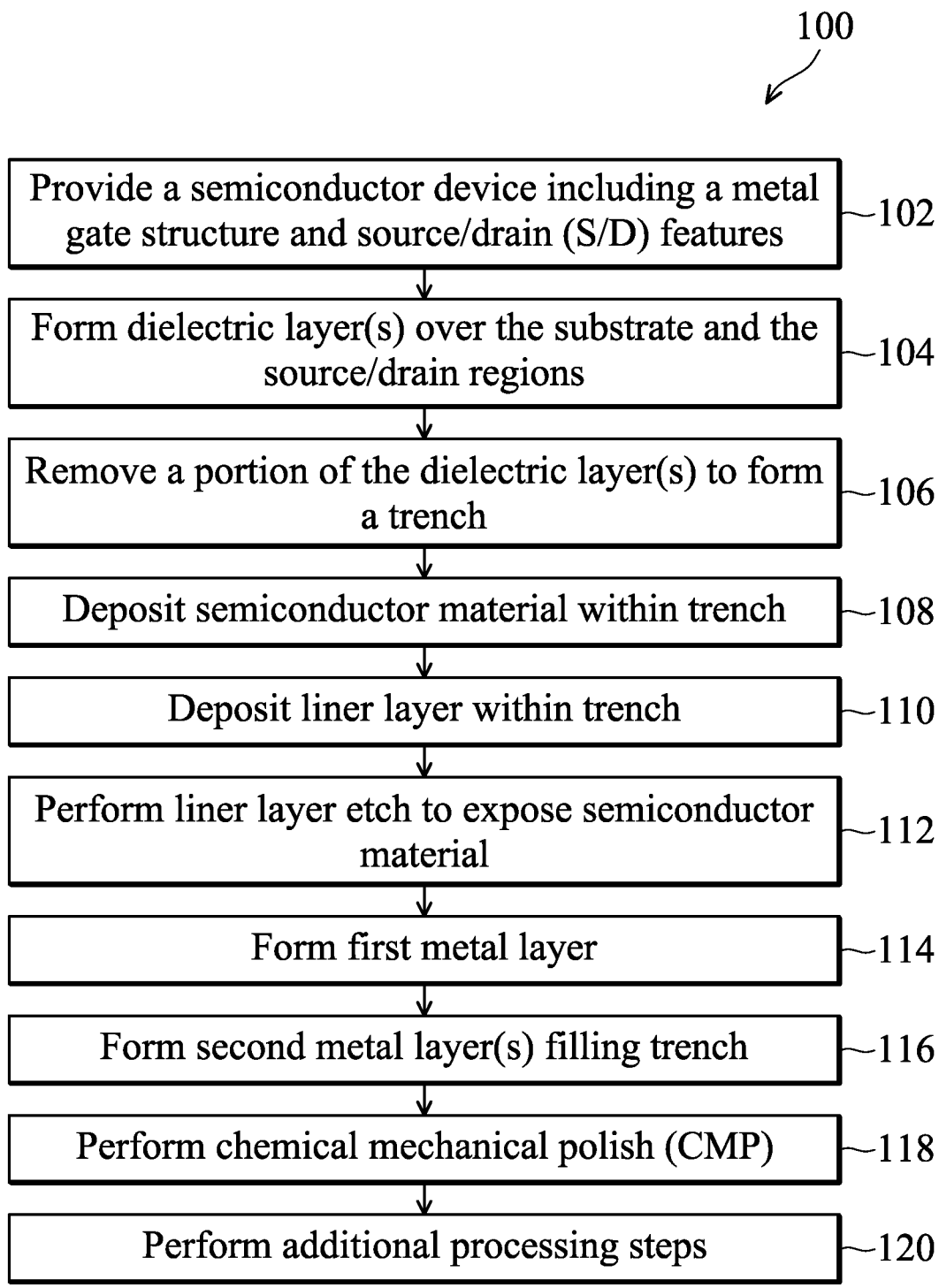
FIG. 1 is a flow chart of a method of fabricating a semiconductor device including a contact feature, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs or three-dimensional fin-like FETs (FinFETs). It is an objective of the present disclosure to provide vertical interconnect features (e.g., via contact features) for connecting device-level contact features (e.g., source/drain features) with additional interconnect features in semiconductor devices.

A device relevant to the present disclosure may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (ω-gate) devices, or Pi-gate (Π-gate) devices. As above, in other embodiments, the device relevant to and fabricated by aspects of the present disclosure may be a planar device.

In semiconductor device fabrication, lithography patterning and etching processes are typically implemented to form a contact trench (or a contact hole or opening) over a device-level feature (e.g., a metal gate stack, a source/drain feature) before depositing a conductive material in the contact trench to form a contact feature to the transistor element—i.e., to a source/drain (S/D) feature or region. In forming contact trenches (or holes or openings) there may be a certain amount of over-etching that is difficult to control and/or desired to ensure removal of the dielectric material. Under-etching a trench that extends to the source/drain region results in an incomplete, high resistance, or even omitted contact. However, the over-etching can impact the source/drain region and thus, device performance. For example, etching into the semiconductor material removes a portion of the source/drain region and thus, a portion of the available carriers. In some embodiments, loss of material in the source/drain region will introduce contact resistance and/or series resistance from the source/drain region and/or contact thereto. Thus, for these and other reasons, it is desirable to improve methods for forming a contact feature to the source/drain region of the device.

Figure 2:
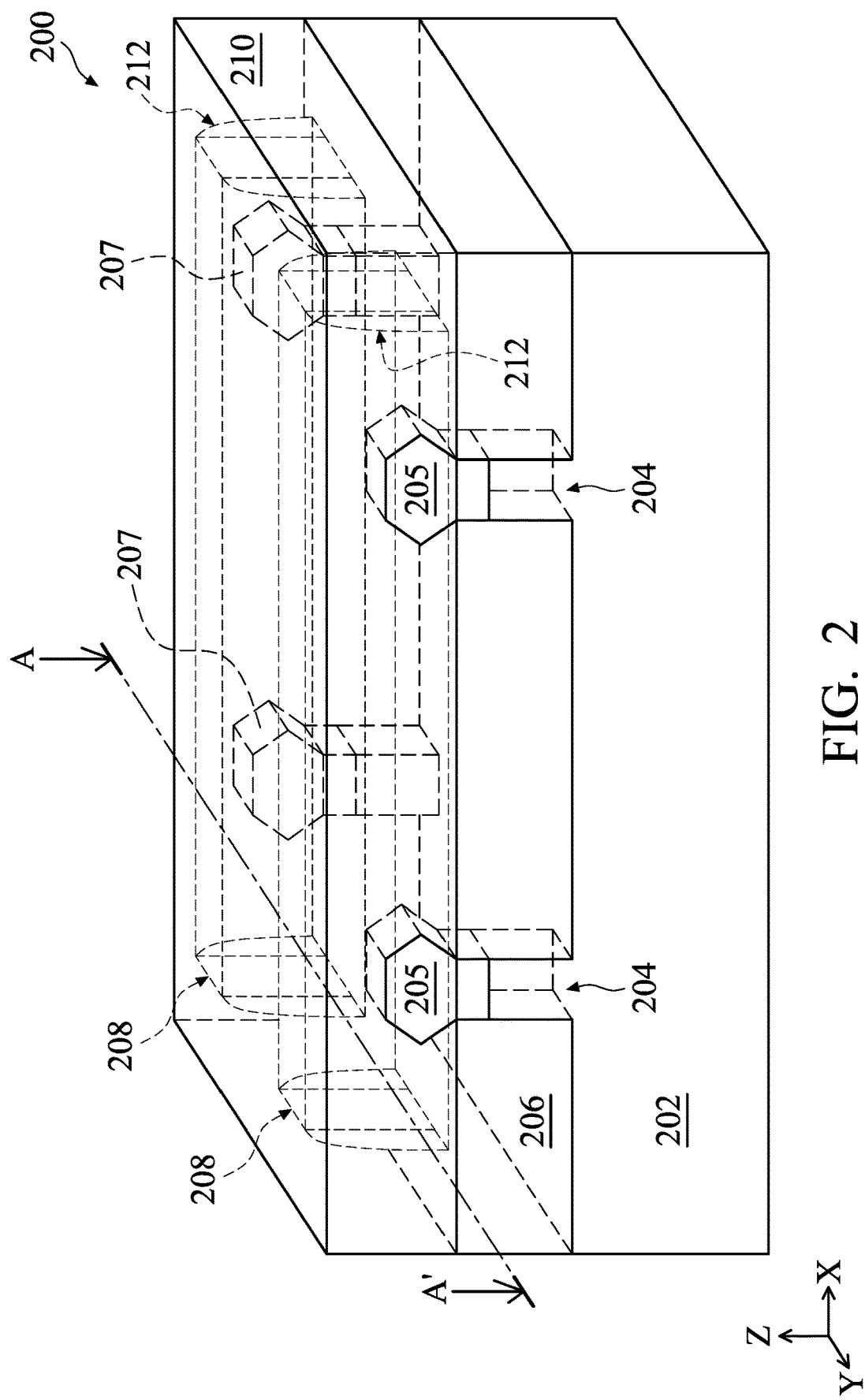
FIG. 2 is perspective view of an embodiment of a FinFET device according to one or more aspects of the present disclosure.
Figure 3A:
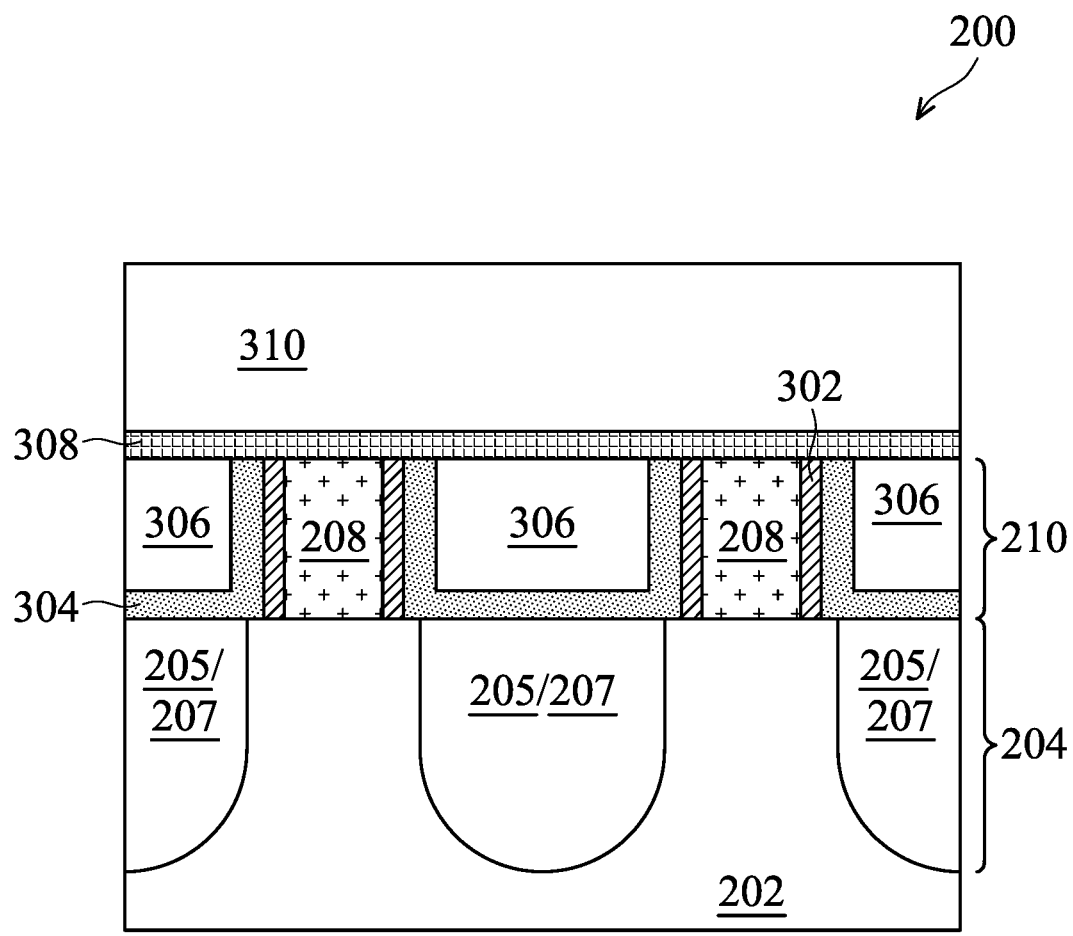
FIGS. 3A, 3B, 4A, 4B, 5A, 5B, 6, 7, 8, 9, 10 and 11 illustrate cross-sectional embodiments according to various steps of the method of FIG. 1, in accordance with some embodiments.
Figure 3B:
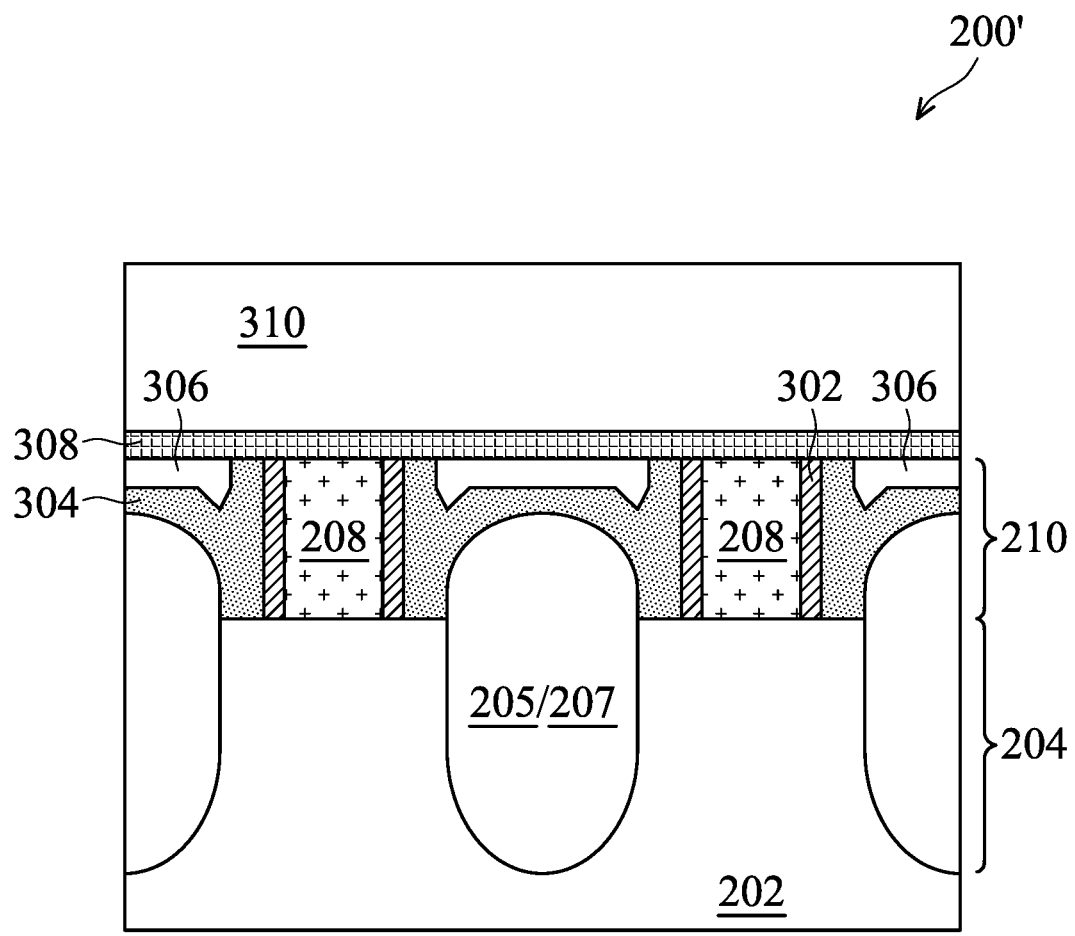
Figure 4A:
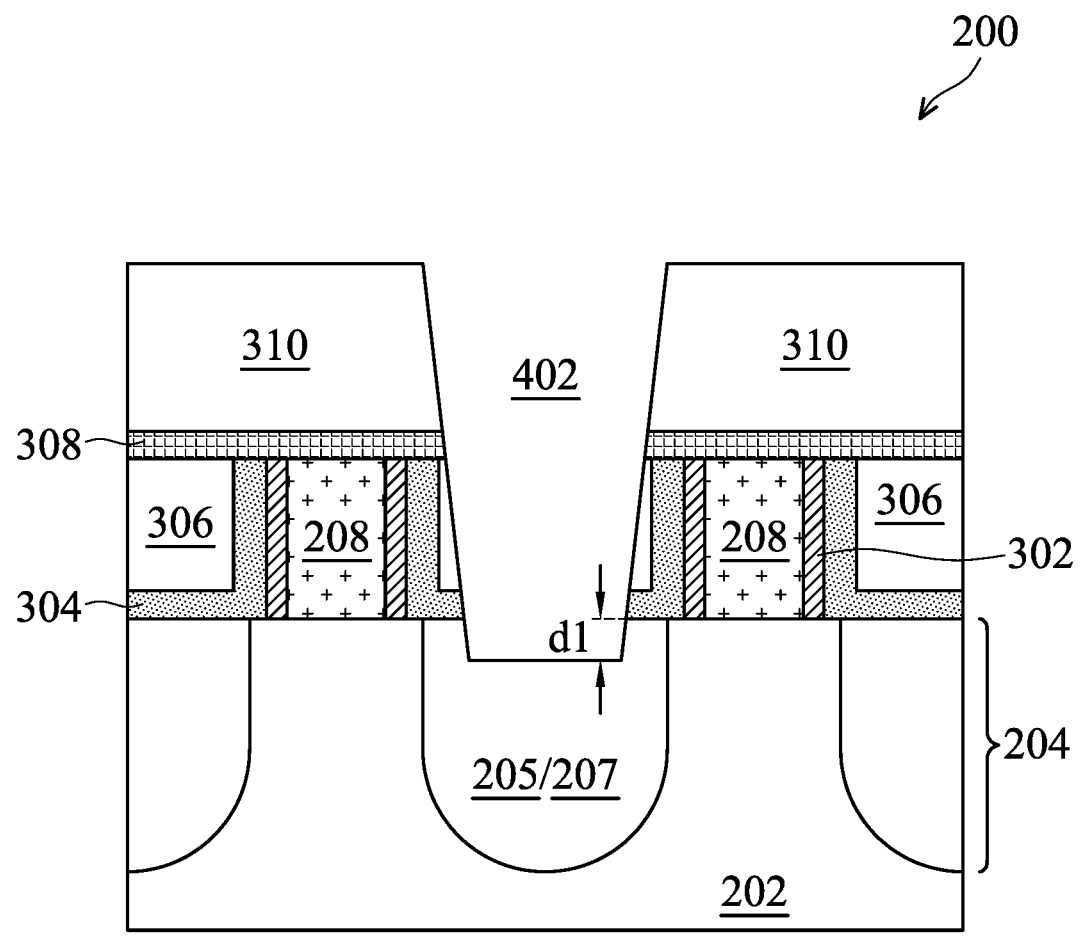
Figure 4B:
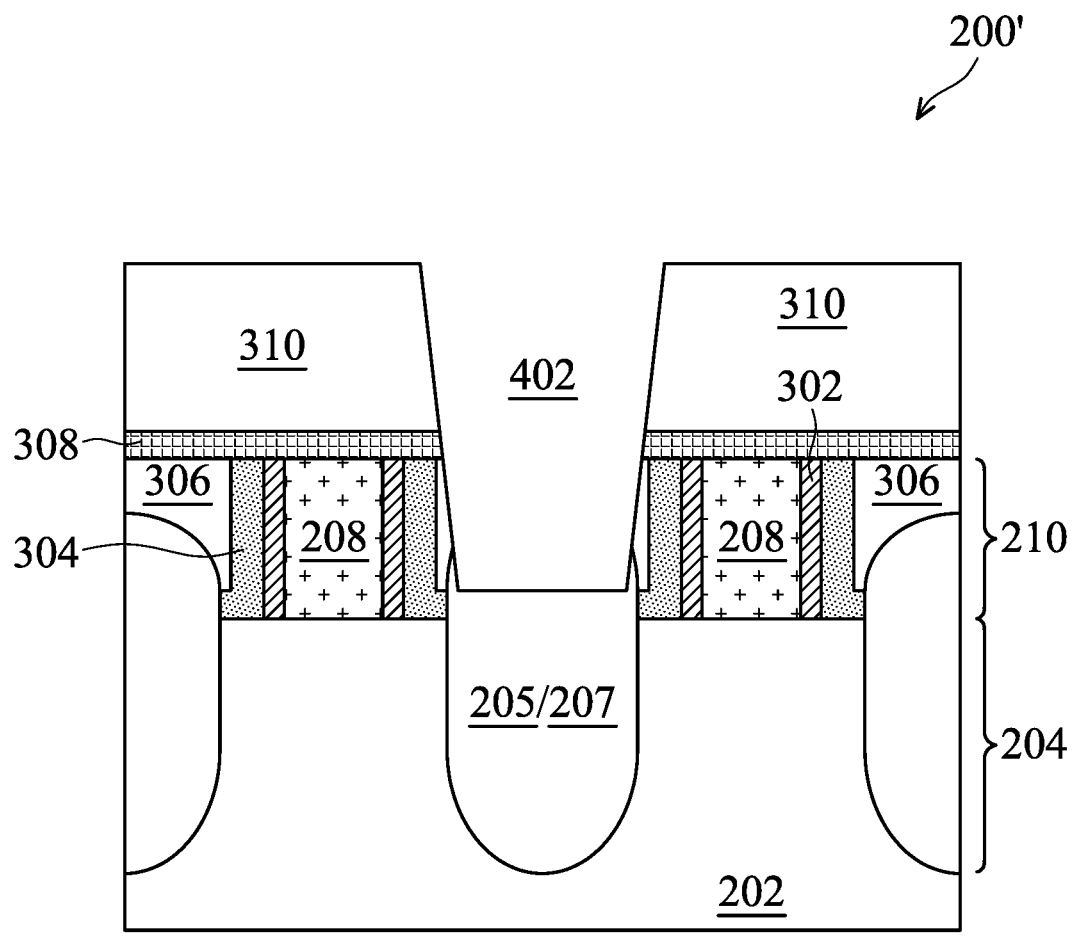
Figure 5A:
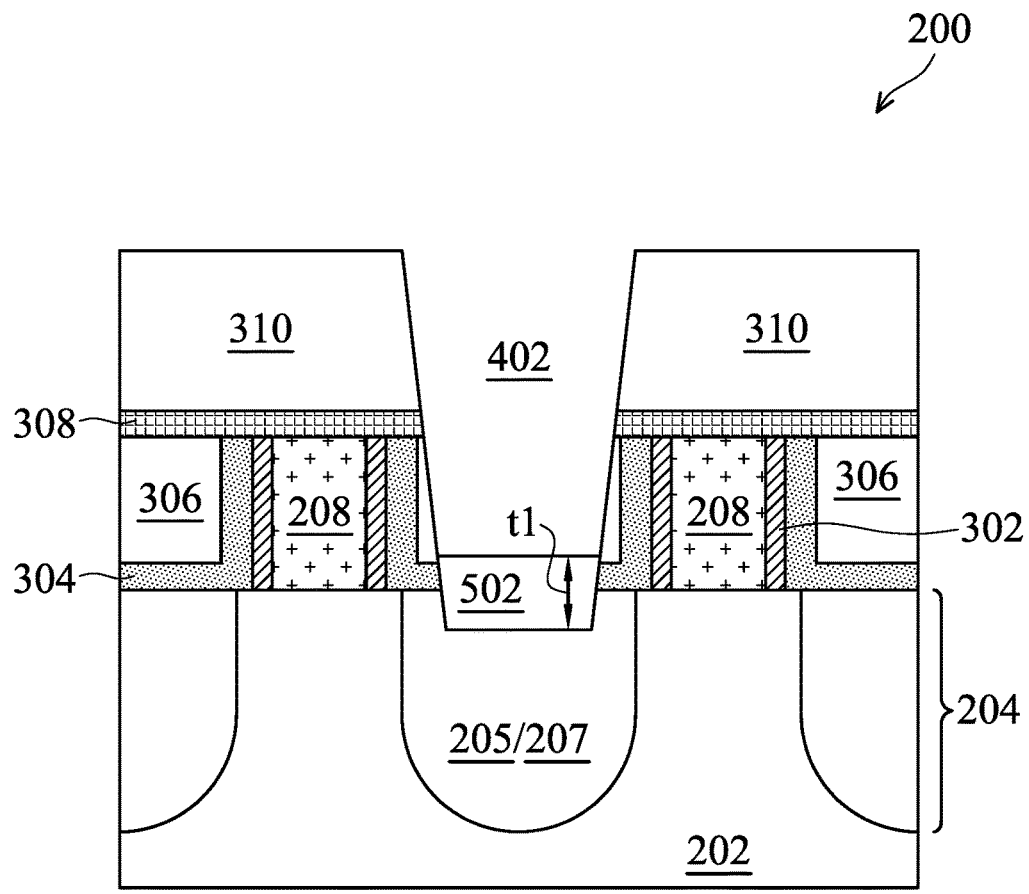
Figure 5B:
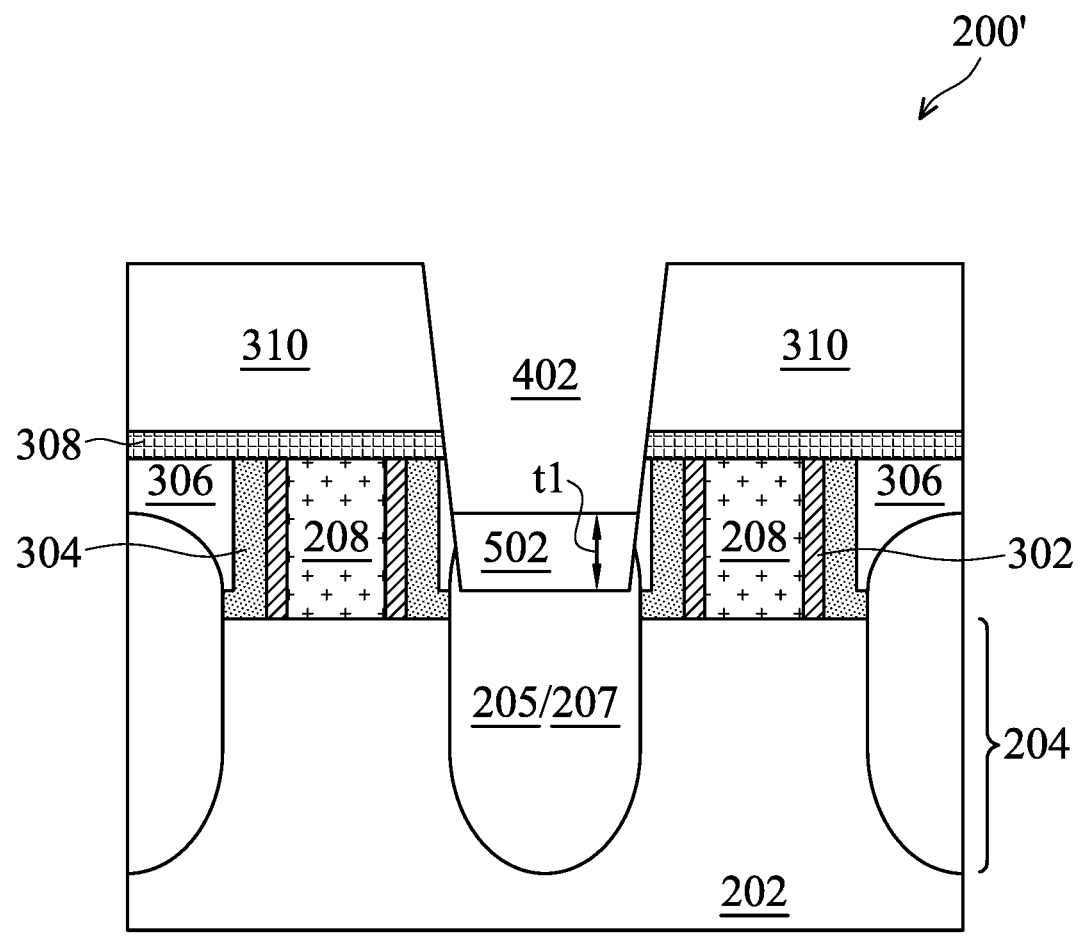

FIG. 1 illustrates an embodiment of a method 100 for forming a semiconductor device according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2-11, which illustrate a portion of the semiconductor device 200 during intermediate steps of the method 100. FIGS. 3A, 4A, 5A, and 6-11 are cross-sectional views of the device 200 taken along dashed line AA' as illustrated in FIG. 2. FIGS. 3B, 4B, and 5B are cross-sectional views of the device 200', which is an embodiment of the device 200, taken along dashed line AA' as illustrated in FIG. 2. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFETs), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, again, though certain examples of the device 200 as illustrated is a three-dimensional FinFET device, the present disclosure may also provide embodiments for fabricating planar FET devices.

The method 100 operation 102 includes providing a device having a gate structure and a source/drain feature also referred to as a source/drain region. The device in some embodiments has a three-dimensional active region (hereafter referred to as fin) disposed over a substrate. The device further includes a gate structure disposed over the fin; source/drain (S/D) features disposed over, on, or in the fin; and various dielectric layer(s) providing suitable insulating and mechanical support functions. In an embodiment, the gate structures are metal gate (MG) structures having a gate electrode comprising metal and an underlying gate dielectric. In an embodiment, the S/D features are epitaxially grown regions that are suitably doped to provide relevant functionality (e.g., p-type or n-type). For example, source/drain regions may, for example, be formed with in-situ P-type doping during epitaxial growth or by implanting P-type dopants after epitaxial growth or by implanting P-type doping into a region of the substrate/fin, and thus may be referred to as P-type source/drain regions. P-type source/drain regions may be used with the associated gate structure formed to establish a PFET. A P-type source/drain region may be formed by forming positively charged particles in the source/drain region by doping. For example, a P-type is element is introduced to the semiconductor to generate free hole (by "accepting" electron from semiconductor atom and "releasing" hole at the same time). P-type dopants may include but are not limited to, for example, boron (B), indium (In) and gallium (Ga). For example, source/drain regions may include silicon germanium and/or any other now known or later developed stressor for generating a compressive stress in the channel of the PFET to enhance the mobility of the holes created by the P-type dopant.

Additionally or alternatively, source/drain regions may be formed with in-situ N-type doping during epitaxial growth or by implanting N-type dopants after epitaxial growth or by implanting N-type doping into a region of the substrate/fin, and thus may be described herein as N-type source/drain regions. N-type source/drain regions may be formed in associated with a gate structure to establish an NFET. An N-type source/drain region may be formed by forming negatively charged electrons in the source/drain region by doping. For example, an N-type is element is introduced to the semiconductor to generate free electron (by "donating" electron to semiconductor). Common N-type dopants include phosphorous (P), arsenic (As), antimony (Sb) and in gallium arsenic (GaAs): sulphur (S), selenium (Se), tin (Sn), silicon (Si), and carbon (C). N-type dopants may include, for example, phosphorous (P), arsenic (As), antimony (Sb). Source/drain regions may include, for example, silicon phosphorus (SiP), and/or any other now known or later developed material for forming an N-type source/drain region.

Continuing the discussion from above, in the example of FIG. 2 illustrated is a FinFET device 200. The FinFET device 200 includes one or more fin-based, multi-gate field-effect transistors (FETs). The FinFET device 200 includes a substrate 202, at least one three-dimensional active region, commonly referred to as a fin, element 204 extending from the substrate 202, isolation regions 206, and a gate structure 208 disposed on and around the fin-element 204. Insulating layer(s) 210 are formed over the substrate 202.

The substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, in some embodiments, the substrate may include an epitaxial layer (epi-layer), the substrate may be strained for performance enhancement, the substrate may include an SOI structure, and/or the substrate may have other suitable enhancement features.

The fin 204, like the substrate 202, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 204 may be fabricated using suitable processes including photolithography and etch processes. The photolithography process may include forming a photoresist layer (resist) overlying the substrate (e.g., on silicon), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 204. The recesses may be etched using a dry etch (e.g., chemical oxide removal), a wet etch, and/or other suitable processes. Numerous other embodiments of methods to form the fins 204 on the substrate 202 may also be used.

Each of the plurality of fins 204 include a source region 205 and a drain region 207 where the source/drain regions 205, 207 are formed in, on, and/or surrounding the fin 204.

The source/drain regions 205, 207 may be epitaxially grown in, on or over the fins 204. As discussed above, the source/drain regions 205, 207 may provide a PFET or NFET and be suitably composed. A channel region of a transistor is disposed within the fin 204, underlying the gate structure 208, along a plane substantially parallel to a plane defined by section AA' of FIG. 2. The channel region of the fin 204 may be differently comprised than the source/drain regions 205, 207 (e.g., silicon and SiGe, silicon and Ge). In some embodiments, the channel region of the fin 204 may have the same composition as the source/drain regions 205, 207 (e.g., silicon, germanium).

Each of the S/D regions 205, 207 may be suitable for forming a p-type FinFET device (e.g., a p-type epitaxial material) or alternatively, an n-type FinFET device (e.g., an n-type epitaxial material). As discussed above, in an embodiment, the p-type epitaxial material may include one or more epitaxial layers of silicon germanium (epi SiGe) doped with a p-type dopant such as boron, germanium, indium, and/or other p-type dopants. In an embodiment, the n-type epitaxial material may include one or more epitaxial layers of silicon (epi Si) or silicon carbon (epi SiC) doped with an n-type dopant such as arsenic, phosphorus, and/or other n-type dopant. In some embodiments, the epitaxial material of the source/drain regions 205, 207 is germanium.

The isolation regions 206 disposed between fins 204 may be shallow trench isolation (STI) features. Alternatively, a field oxide, a LOCOS feature, and/or other suitable isolation features may be implemented on and/or within the substrate 202. The isolation regions 206 may be composed of such as tetraethylorthosilicate (TEOS), silicon oxide, silicon nitride, silicon oxynitride, a low-k dielectric material, doped silicon oxide such as borophosphosilicate glass (BPSG), phosphosilicate glass (PSG), fluorine-doped silicate glass (FSG), boron doped silicate glass (BSG), other suitable dielectric materials, combinations thereof, and/or other suitable material known in the art. In an embodiment, the isolation structures are STI features and are formed by etching trenches in the substrate 202. The trenches may then be filled with isolating material(s), followed by a chemical mechanical polishing (CMP) process and subsequent etch-back processes. However, other embodiments are possible. In some embodiments, the isolation regions 206 may include a multi-layer structure, for example, having one or more liner layers.

The gate structure 208 includes a gate stack including a gate dielectric layer, and one or more conductive layers (e.g., polysilicon or metal layer(s)) formed over the gate dielectric layer. In some embodiments, the gate dielectric layer may include an interfacial layer formed over the channel region of the fin 204 and a high-K dielectric layer over the interfacial layer. The interfacial layer of the gate dielectric layer may include a dielectric material such as silicon oxide layer ($SiO_2$) or silicon oxynitride (SiON). The high-K dielectric layer of the gate dielectric layer may include $HfO_2$, $TiO_2$, HfZrO, $Ta_2O_3$, $HfSiO_4$, $ZrO_2$, $ZrSiO_2$, combinations thereof, or other suitable materials. In still other embodiments, the gate dielectric layer may include silicon dioxide or another suitable dielectric. The gate dielectric layer may be formed by chemical oxidation, thermal oxidation, atomic layer deposition (ALD), physical vapor deposition (PVD), chemical vapor deposition (CVD), and/or other suitable methods. In an embodiment, the conductive gate material is a metal layer. The metal layer may include a conductive layer such as W, TiN, TaN, WN, Re, Ir, Ru, Mo, Al, Cu, Co, Ni, combinations thereof, and/or other suitable compositions. In some embodiments, the metal layer may include a first group of metal materials for N-type FinFETs and a second group of metal materials for P-type FinFETs. Thus, the device 200 may include a dual work-function metal gate configuration. For example, a metal layer (e.g., for N-type devices) may include metals having a work function substantially aligned with a work function of the substrate conduction band, or at least substantially aligned with a work function of the conduction band of the channel region of the fin 204. Similarly, for example, a metal layer (e.g., for P-type devices) may include metals having a work function substantially aligned with a work function of the substrate valence band, or at least substantially aligned with a work function of the valence band of the channel region of the fin 204. Thus, the metal layer(s) may provide a gate electrode for the FinFET device 200. In some embodiments, the gate electrode of the gate structure 208 is provided by a polysilicon layer. The gate electrode of the gate structure 208 may be formed using PVD, CVD, electron beam (e-beam) evaporation, and/or other suitable process. In some embodiments, sidewall spacers 302 (see FIG. 3A, 3B) are formed on sidewalls of the gate structure 208. The sidewall spacers 302 may include a dielectric material such as $SiO_2$, SiN, SiC, SiON, SiOC, SiOCN, SiCN, or combinations thereof. The sidewall spacers 302 may include, in some embodiments, multiple layers.

As discussed above, in some embodiments, the source/drain regions 205, 207 are epitaxial source/drain features which may be formed by one or more epitaxial processes. In some cases, the epitaxial source/drain features 205, 207 may be formed in, on, and/or surrounding the fin 204. For example, in some embodiments, fin 204 is formed extending from the substrate 202, and subsequently, the fin 204, at the region of the source/drain features 205, 207 is etched back to form a trench in the fin 204. The epitaxial source/drain features 205, 207 may be grown in and/or extending from the trench. In other embodiments, the source/drain features 205, 207 may be formed surrounding the fin 204. In some embodiments, such as in a gate-all-around device, portions of semiconductor material (e.g., forming the channel of the GAA device) may extend in the region on and/or between which the source/drain features 205, 207 may be formed (e.g., as cladding). In still other embodiments, the fin 204 may be suitably doped to provide the source/drain features 205, 207 or portions thereof.

The method 100 then proceeds to block 104 where one or more insulating layers are formed over the gate structure and the source/drain features. FIG. 2 illustrates an insulating layer(s) 210 formed over substrate 202 such that it is formed adjacent the gate structures 208 and over the source/drain regions 205/207. The insulating layer 210 may include a plurality of layers such as illustrated in FIGS. 3A/3B. For example, in some embodiments, the insulating layer 210 includes sidewall spacers 302, contact etch stop layers (CESL) 304, and inter layer dielectric (ILD) 306. In an embodiment, the ILD 306 is referred to as ILD0 as it is the lowest of a plurality of ILD layers of multi-layer interconnect structure formed over the substrate 202. In an embodiment, CESL 304 may comprise silicon nitride, silicon oxynitride, silicon nitride with oxygen or carbon elements, other suitable materials, or combinations thereof, and may be formed by CVD, PVD, ALD, other suitable methods, or combinations thereof.

By way of example, the ILD layer 306 may include a dielectric material, such as tetraethylorthosilicate (TEOS), silicon oxide, a low-k dielectric material, doped silicon oxide such as borophosphosilicate glass (BPSG), phosphosilicate glass (PSG), fluorine doped silicate glass (FSG), boron doped silicate glass (BSG), other suitable dielectric materials, or combinations thereof. The ILD layer 306 may include a multi-layer structure having multiple dielectric materials and may be formed by a deposition process such as, for example, CVD, FCVD, PECVD, SOG, other suitable methods, or combinations thereof.

In an embodiment, one or more of the dielectric materials of the insulating layer 210 may be formed over the gate structures 208 and subsequently planarized to expose a top surface of the gate structure 208. In some further embodiments, after the planarization a dummy gate (e.g., polysilicon) of the gate structure 208 is removed and replaced with a metal gate electrode forming the gate structure 208. This is can be referred to as a gate-replacement process.

In some embodiments, block 104 of the method 100 continues to form additional insulating (dielectric material) layers over the substrate including the gate structure and/or source/drain features. In an embodiment, an etch stop layer 308 is formed over the gate structure 208 and/or the insulating layer(s) 210. In an embodiment, the etch stop layer 308 is silicon nitride or other suitable composition. In various examples, the etch stop layer 308 may be deposited by ALD, CVD, PVD, or by another suitable method. In an embodiment, another inter layer dielectric (ILD) layer 310 is formed over the gate structure 208 and the source/drain features 205/207. The ILD layer 310 may be referred to as ILD1 and may be disposed above the ILD layer 306 (e.g., ILD0). By way of example, the ILD layer 310 may include a dielectric material, such as tetraethylorthosilicate (TEOS), silicon oxide, a low-k dielectric material, doped silicon oxide such as borophosphosilicate glass (BPSG), phosphosilicate glass (PSG), FSG, boron doped silicate glass (BSG), other suitable dielectric materials, or combinations thereof. The ILD layer 310 may include a multi-layer structure having multiple dielectric materials and may be formed by a deposition process such as, for example, CVD, FCVD, PECVD, SOG, other suitable methods, or combinations thereof. The ILD layers 310 and 306 may include the same or different compositions.

As will be appreciated having formed the transistor features such as gate structure 208 and source/drain features 205, 207, it is necessary to provide a connection to these transistor features such that the device 200 can be controlled and interconnected with other devices to form an integrated circuit. As will be appreciated by the discussion below, embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for reducing a resistance (e.g., on-state resistance), by the etching optimization and replacement of source/drain region material during fabrication of contact features. The methods and devices provided herein can control contact and series resistance. Various embodiments disclosed herein may also generally be used to improve process control and/or reduce process cost and complexity. Additional embodiments and advantages are discussed below and/or will be evident to those skilled in the art in possession of this disclosure.

The method 100 then proceeds to block 106 where a portion of the dielectric or insulating layers overlying the source/drain regions are removed. The removal of the insulating material provides a trench extending through the dielectric layers reaching and exposing the source/drain region. The removal is also referred to as forming a contact opening. Referring to the example of FIG. 4A/4B, a trench 402 is etched in the dielectric layers (e.g., ILD 310, ESL 308, ILD 306, CESL 304). In some embodiments, a portion of the gate spacers 302 may also be etched (e.g., if a trench 402 is misaligned or the spacing between gate structures 208 is tight). The trench 402 may be formed by a photolithography process defining the trench region such as by a masking element disposed above the ILD 310, and an etching process defined by the masking element to form the trench as defined by the masking element. While a single trench 402 is illustrated, any number of trenches are possible. Further, in some embodiments, a trench extending to contact the gate structure 208 may concurrently formed. In some embodiments, the contact opening to the gate structure is separately formed.

In some embodiments, the etching process is a dry etching process that employs one or more etchant, such as a fluorine-containing gas (e.g., $C_4F_6$, $CF_4$, $SF_6$, $CH_2F_2$, $CHF_3$, and/or $C_2F_6$), oxygen, hydrogen, other suitable gases, or combinations thereof. In some embodiments, the etching process includes a plasma etch. In some embodiments, the etching process is a wet etching process. Combinations of dry (e.g., plasma) etching and wet etching are possible.

In an embodiment, the etching process forming the trench 402 over-etches (e.g., continues past a bottom surface of the insulating layer(s)) and extends into the source/drain region 205, 207 such that the etching removes a portion of the semiconductor material of source/drain region 205, 207 forming a recess. The over-etching may a by-product of control of the timed etch, or be purposefully designed into the timed etched. In an embodiment, the material removed from the source/drain region 205, 207 is epitaxially grown semiconductor material such as silicon, silicon germanium, germanium, silicon carbide, or other suitable materials as discussed above. In a further embodiment, the material removed is suitably doped epitaxially grown semiconductor material such as, doped with boron, phosphorus, arsenic and/or other dopant types including as discussed above.

In an embodiment, a depth d1 is removed from the source/drain region 205, 207 in forming the trench 402. In other words, the recess formed in the source/drain region 205, 207 has a depth d1. In an embodiment, the depth d1 may be between approximately 1 nanometers (nm) and approximately 20 nm. In a further embodiment, d1 is measured from a gate level, or a level coplanar with a bottommost point on the gate structure (e.g., gate dielectric layer such as the interfacial layer). In an embodiment, the depth d1 is between approximately 2% and approximately 30% of the thickness source/drain region 205, 207 or its overall, original depth. For example, in an embodiment depth d1 is measured from a bottom surface of the source/drain region 205, 207 epitaxial material vertically extending to an original top surface of the epitaxially grown material.

The method 100 then proceeds to block 108 where, after the etching of block 106, a semiconductor material is formed within trench. Referring to the example of FIG. 5A/5B, a semiconductor material 502 is provided on the source/drain region 205/207. In an embodiment, the semiconductor material 502 is deposited within recess of the depth d1 created by the removal of material the source/drain region 205/207 discussed above in block 106. In some embodiments, the semiconductor material 502 extends above the depth d1 of the recess. As such, the semiconductor material 502 has a thickness t1. In an embodiment, t1 is greater than d1. In an embodiment, the thickness t1 of the deposited semiconductor material 502 may be between approximately 2 nm and 30 nm in thickness. In an embodiment, the thickness t1 is between approximately 2% and approximately 30% of the thickness source/drain region 205, 207 or its overall, original depth. Including as illustrated in FIG. 5A, in an embodiment, the semiconductor material 502 is grown to a height above that of the CESL 304.

In some embodiments, the semiconductor material 502 is selectively grown on the source/drain region 205, 207. The selective growth may include epitaxial growth from the semiconductor material of the source/drain region 205, 207 (e.g., as a seed), while material is not grown on the surrounding insulating layers.

The semiconductor material 502 may be formed by processes where the temperature is maintained within the allowed thermal budget. In some embodiments, the process temperature to form the semiconductor material 502 is less than 500 Celsius. Further exemplary process conditions are described below. In a further embodiment, the semiconductor material 502 is grown at a process temperature of 350 C.

In an embodiment, the semiconductor material 502 may be silicon. In an embodiment, the silicon is not purposefully doped. In an embodiment, the semiconductor material 502 may be formed by epitaxial growth, CVD, PECVD, ALD, PEALD, and/or other suitable process. The precursors of the formation process may include a silicon source, inert materials, and/or other suitable reactive and non-reactive materials. Exemplary precursors include silane, di-silane, di-chloride silane, Hex-c H2, N2, O2, NH3, HF, F2, NF3, Cl2, Ar, He, and/or other suitable precursors. Exemplary flow rates of the precursors include gas flow rate ranges of between approximately 10 standard cubic centimeters per minute (sccm) and approximately 20000 sccm. Precursor to carrier gas ratio may be between approximately 0.001 to approximately 0.5. In some embodiments, the temperature of the process forming the semiconductor material 502 is between approximately room temperature (RT) and 700 Celsius. It is noted that as discussed above, the thermal budget should be accounted for the determination of the allowable temperature range. In some embodiments, the pressure of the process forming the semiconductor material 502 is between approximately 0.01 and 100 Torr. The epitaxial growth process may be performed for between about 1 minute and about 30 minutes.

Continuing with the description of various embodiments above, it is understood that various parameters of the described deposition process can be tuned to achieve desired growth characteristics of the silicon (SiGe) material including those parameters discussed above. A flow rate of a deposition gas (including the silicon-comprising precursor gas, the carrier gas, and/or the etching gas), a concentration (or dosage) of the silicon-comprising precursor gas, a concentration (or dosage) of the carrier gas, a concentration (or dosage) of the etching gas, a ratio of the concentration of the silicon-comprising precursor gas to the concentration of the carrier gas, a ratio of the concentration of the silicon-comprising precursor gas to the concentration of the etching gas, a ratio of the concentration of the carrier gas to the concentration of the etching gas, a power of a radiofrequency (RF) source (for example, used during the deposition process to generate a plasma), a bias voltage (for example, applied during the deposition process to excite the plasma), a pressure (for example, of a chamber in which the deposition process is performed), a duration of the deposition process, other suitable deposition parameters, or combinations thereof. These parameters may be selected to provide the suitable concentration of SiGe (e.g., atomic ratio of silicon and germanium), the tuning the speed and/or direction to epitaxial growth, tuning the defect density of the grown material, and/or other suitable considerations. It is noted that as this epitaxial material is consumed at least in part with the formation of the silicide (discussed below), certain process parameters may be relaxed with respect to the growth of epitaxial material for providing the carrier region of the source/drain.

In some embodiments, a duration of the deposition process, a flow rate of the deposition gas, a temperature of the deposition process, and a pressure of the deposition process are tailored to ensure that the silicon (SiGe) material grows (deposits) more quickly on source/drain Si or SiGe surfaces than oxide surfaces (i.e., sidewall of contract trench).

In an embodiment, the duration of the deposition process is between about 1 ms to about 10 min. In some embodiments, the deposition process may include multiple cycles. In an embodiment, a flow rate of the deposition gas is about 10 sccm (standard cubic centimeters) to about 20,000 sccm. As discussed above, the deposition gas can include a carrier gas(es) and one or more precursor gases. In an embodiment, the epitaxial deposition process is performed at a pressure of about 0.01 Torr to about 100 Torr. In an embodiment, the deposition process is a low temperature deposition process, for example, performed at a temperature less than about 700° C. In some embodiments, the temperature is about room temperature (for example, about 20° C. to about 25° C.) to about 700° C.

In an embodiment of the device 200 (e.g., a pMOS device), the source/drain region 205, 207 is silicon germanium. In a further embodiment, the semiconductor material 502 is silicon and is formed from this silicon germanium surface (e.g., seed). In an embodiment of the device 200 (e.g., nMOS device), the source/drain region 205, 207 is suitably doped silicon. In a further embodiment, the semiconductor material 502 is silicon and is formed from this doped silicon surface (e.g., seed) of the source/drain region 205, 207. In an embodiment of the device 200, the source/drain region 205, 207 is germanium. In a further embodiment, the semiconductor material 502 is silicon and is formed from the germanium surface (e.g., seed). Additional combinations are possible including those discussed above.

Figure 6:
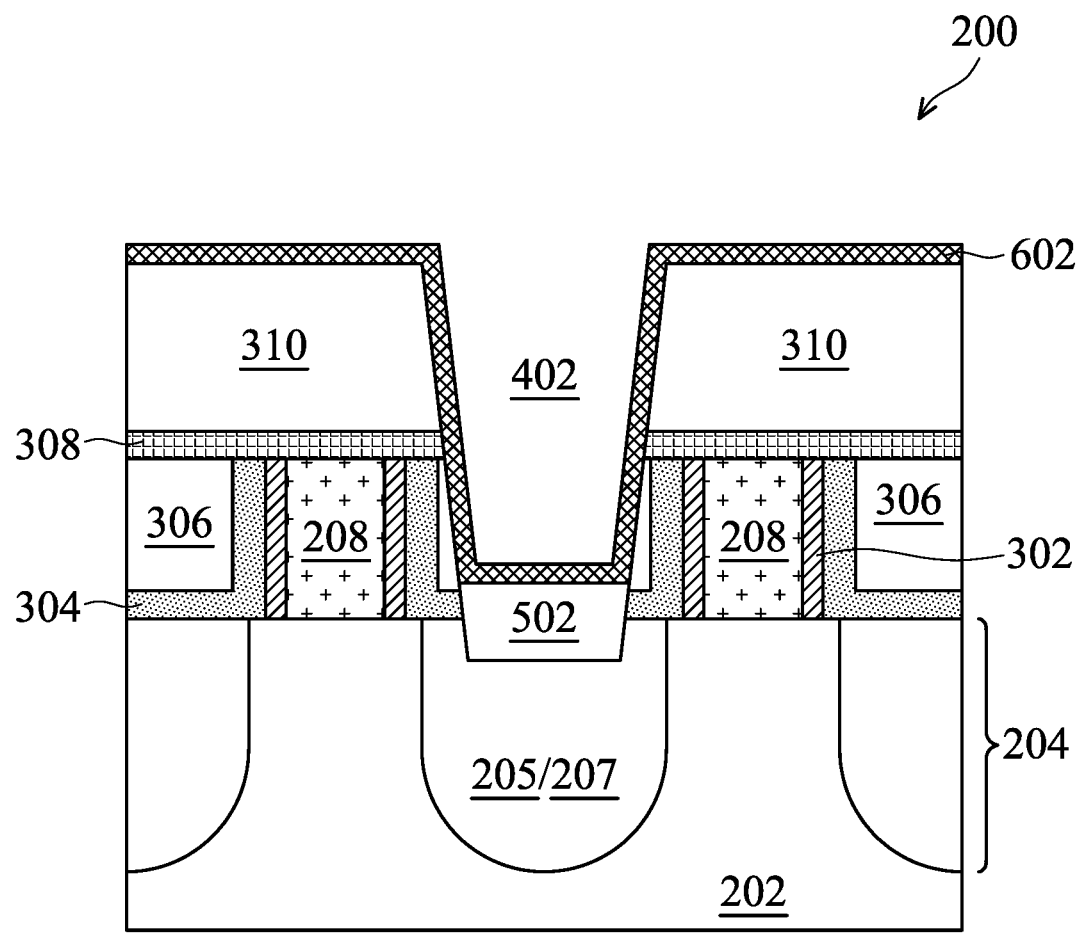

The method 100 then proceeds to block 110 where a liner layer is deposited within trench, for example, along the sidewalls of the trench and on the semiconductor material formed in block 108. The liner layer may serve to provide isolation between the subsequently formed contact conductive materials and the surrounding insulating materials. Referring to the example of FIG. 6, a liner layer 602 is illustrated. In an embodiment, the liner layer 602 is silicon nitride. Other exemplary materials include those providing a barrier between the subsequently deposited metal and the surrounding features. Exemplary thicknesses of the liner layer 602 include between approximately 0.5 nm and approximately 25 nm nanometers. The liner layer may be formed by ALD, CVD, and/or other suitable processes. As illustrated in FIG. 6, the liner layer 602 may be a conformal layer.

The method 100 then proceeds to block 112 where the liner layer, discussed above with respect to block 110, is etched. The liner layer may be etched to expose a surface of the semiconductor material deposited above in block 108. Referring to the example of FIG. 7, the liner layer 602 is etched forming opening 702 in the liner layer exposing the semiconductor material 502. In embodiments, the liner layer 602 over the ILD layer 310 is also removed. The liner layer 602 may be etched by a selective etch. Exemplary etches include wet etch and/or dry etches (e.g., plasma etching).

Figure 7:
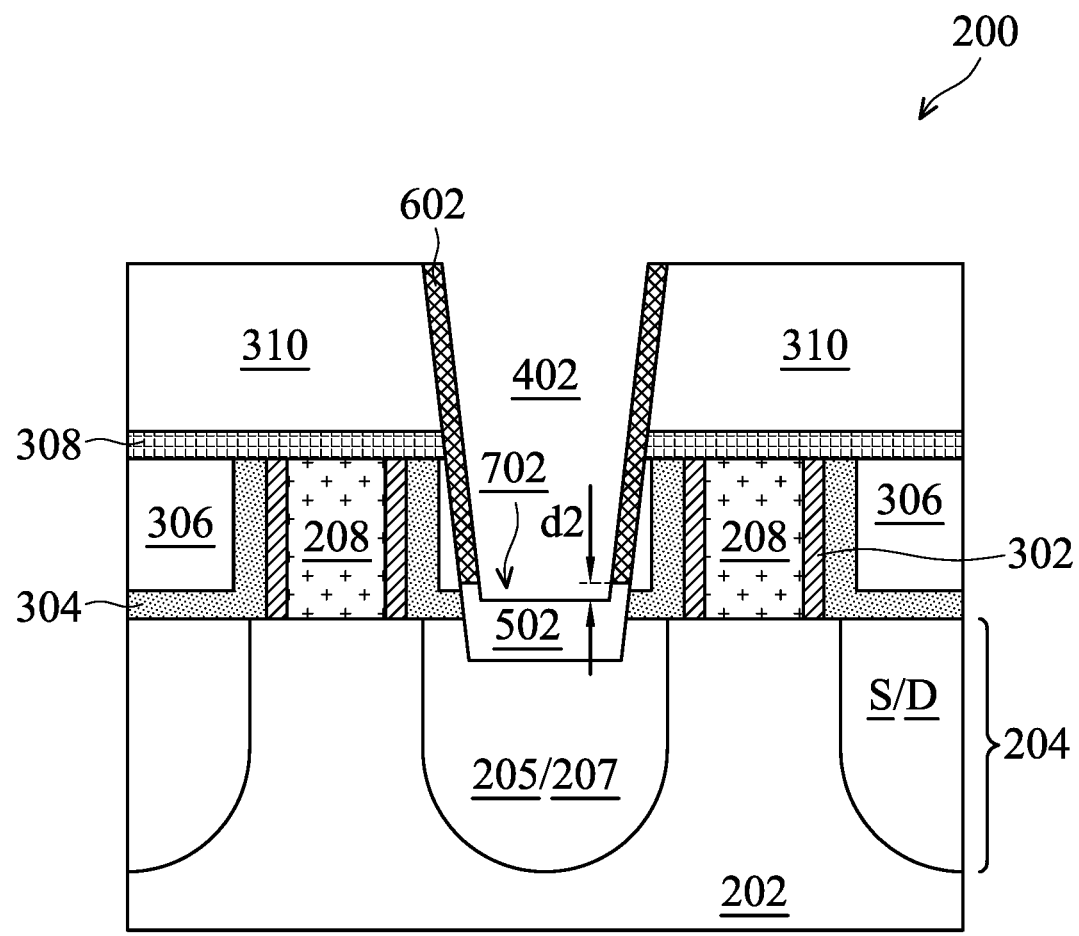

In some embodiments, a degree of over-etch is also experienced in the etching of block 110. Thus, the etching extends into the semiconductor material 502 removing a portion of the semiconductor material 502 forming a recess. As illustrated in FIG. 7, a depth d2 is removed from the semiconductor material 502. In other words, in an embodiment, the recess has a depth d2. In an embodiment, the depth d2 is between approximately 0 nm and approximately 10 nm. In a further embodiment, the depth d2 is approximately 2 nm. In an embodiment, d2 is less than d1. In an embodiment, d2 is less than t1.

The method 100 then proceeds to block 114 where a first metal layer is formed. The first metal layer is formed within the trench. The first metal layer may be a silicide region formed by converting the semiconductor material formed in block 108. In some embodiments, the first metal layer is formed by a silicidation process targeting and converting the silicon of semiconductor layer provided in block 108 to silicide. The silicidation process may include depositing a metal composition over the semiconductor material (e.g., 502) and annealing the structure to form a metal silicide. In some embodiments, the silicide layer includes a metal silicide, such as nickel silicide, cobalt silicide, tungsten silicide, tantalum silicide, titanium silicide, platinum silicide, erbium silicide, palladium silicide, other suitable silicides, or combinations thereof. Thus, exemplary metals formed over the semiconductor material (e.g., silicon) include nickel, cobalt, tungsten, tantalum, titanium, platinum, erbium, palladium, and/or other suitable metals.

Figure 8:
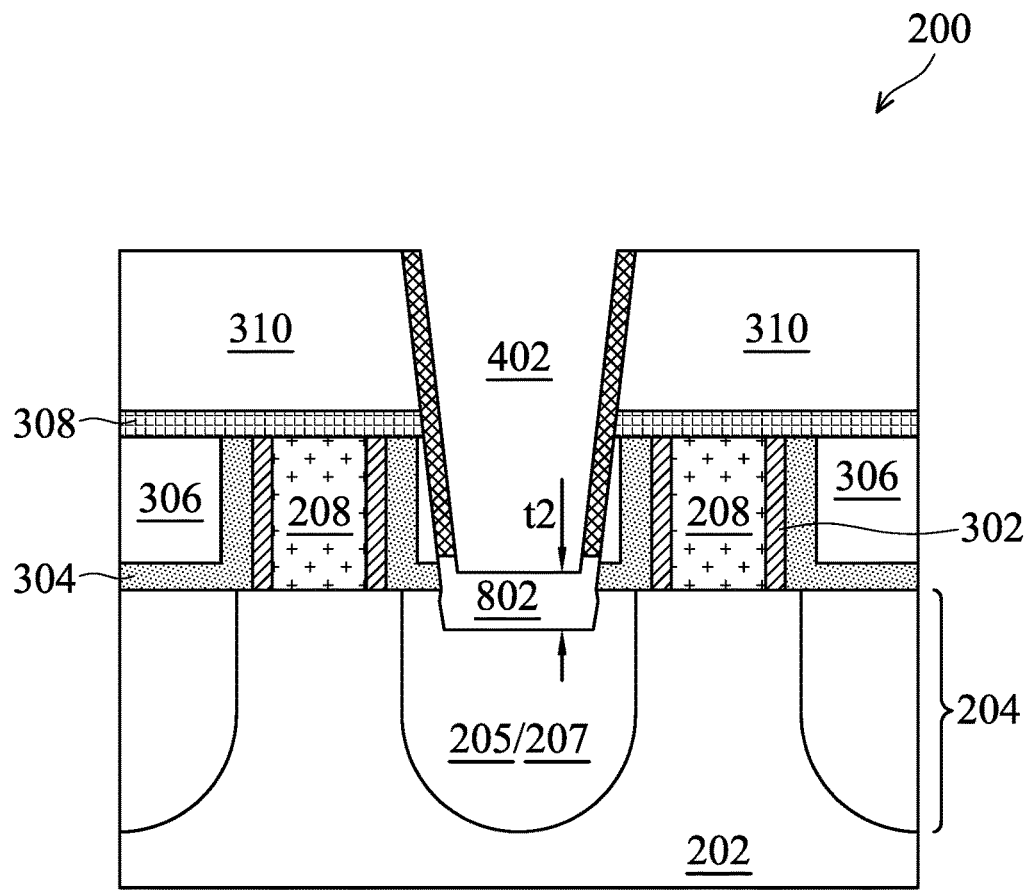

Referring to the example of FIG. 8, the silicide region 802 is formed. The silicide region 802 may consume the semiconductor material 502 in its entirety. In some embodiments, a portion of the source/drain region 205, 207 underlying the semiconductor material 502 is also consumed to form the silicide region 802. In an embodiment, the silicide region 802 is titanium silicide (TiSi). However, other suitable silicide compositions are possible. As discussed above, in some embodiments, the silicide region 802 may be formed by a deposition process such as CVD, ALD, PVD, other suitable processes, or combinations thereof of a metal material. The deposited metal layer (e.g., titanium) is formed over and interfacing the semiconductor material 502. Then, the device 200 is annealed to allow the metal and the semiconductor material 502 and/or the source/drain region 205, 207 to react forming silicide. Thereafter, the un-reacted metal layer is removed, leaving the silicide region 802 over the source/drain regions 205, 207.

Figure 9:
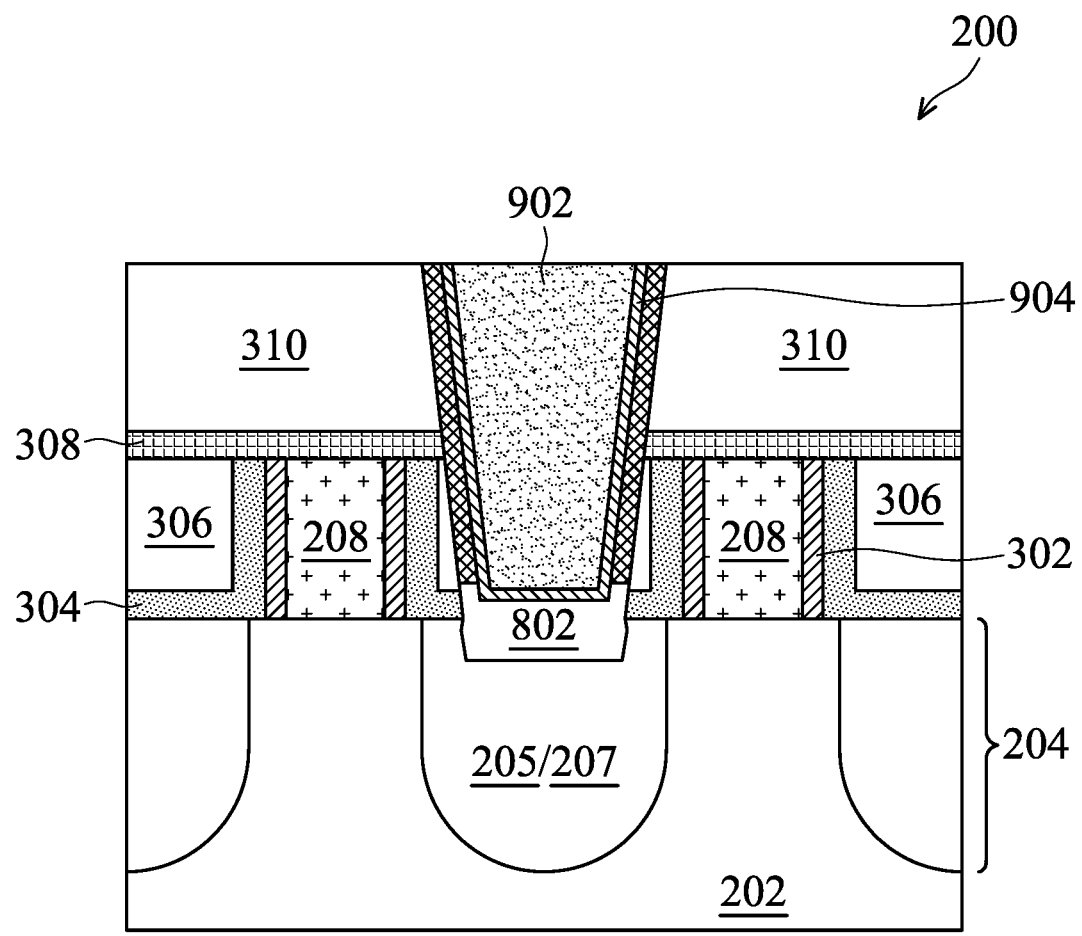

The method 100 then proceeds to block 116 where a second metal layer(s) is deposited. In some embodiments, one or more conductive layers are deposited such that the remained of the contact opening is filled. The second metal layer(s) may be referred to a contact metal(s). As illustrated in FIG. 9, contact metal layer 902 may be deposited within the trench 402 and interfacing the silicide region 802 over the source/drain regions 205, 207 such that metal layer 902 provides an electrical connection, through the silicide region 802, to the source/drain features 205/207. In at least some examples, the contact metal layer 902 includes a Co layer. In some examples, the contact metal layer 902 includes tungsten W. However, other suitable metals or combinations thereof may be used without departing from the scope of the present disclosure including, for example, Ru, Cu, Ta, Ti, Al, Mo, and the like. In some cases, the metal layer 902 may be deposited by PVD, e-beam evaporation, CVD, ALD, plating, or other appropriate method. The metal layer 902 may be multi-layer structure. After deposition of the metal material, a CMP process in block 118 may be performed removing the material from over the ILD layer 310 and providing a planar surface of the metal layer 902 and the ILD layer 310.

The method 100 may proceed to perform additional processing steps in block 120. In some embodiments, additional layers are formed, for example, prior to forming the metal layer 902. For example, adhesion layers may be formed on the trench 402 prior to deposition of the metal layer 902. The adhesion layer 904 is illustrated in FIG. 9. Example materials for the adhesion layer 904 include various conductive materials such as TiN, TaN, and/or other suitable materials.

The contact metal layer 902 (and adhesion layer 904) and the silicide region 802 may together be referred to a contact element or contact via element. The contact element provides electrical connection to the source/drain regions 205, 207. While a single contact is shown in FIG. 9, numerous contacts may be formed to respective ones of the source/drain regions 205/207 and also contact elements may be formed to the gate structure 208 (not shown).

The device 200 may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more FET (e.g., FinFET) devices. In furtherance of the example, a multilayer interconnection may include vertical interconnects, such as vias or additional contacts, and horizontal interconnects, such as metal lines. The various interconnection features may employ various conductive materials including copper, tungsten, silicide, cobalt, and/or other conductive materials. In one example, a damascene and/or dual damascene process is used to form a copper related multilayer interconnection structure.

Figure 10:
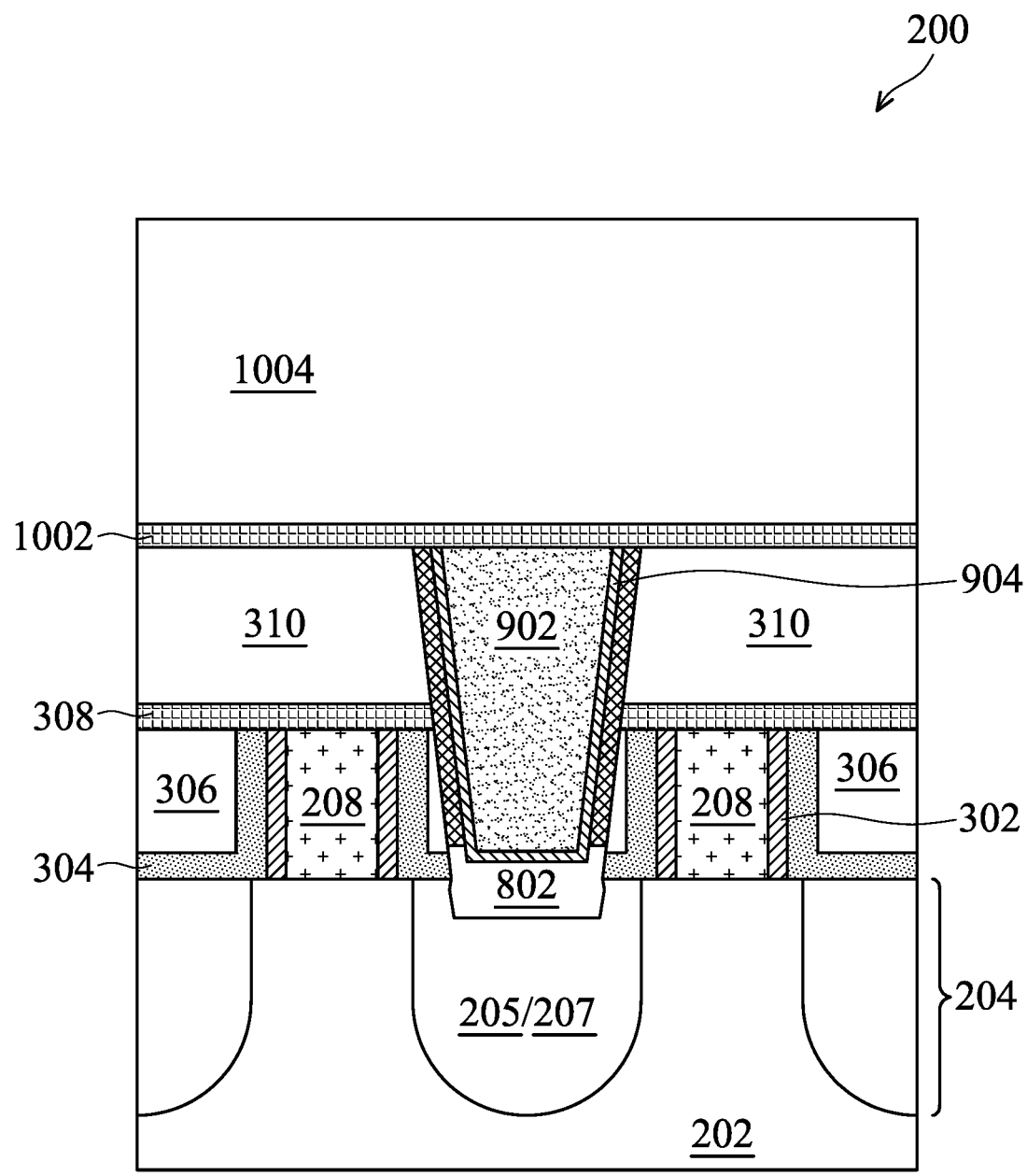
Figure 11:
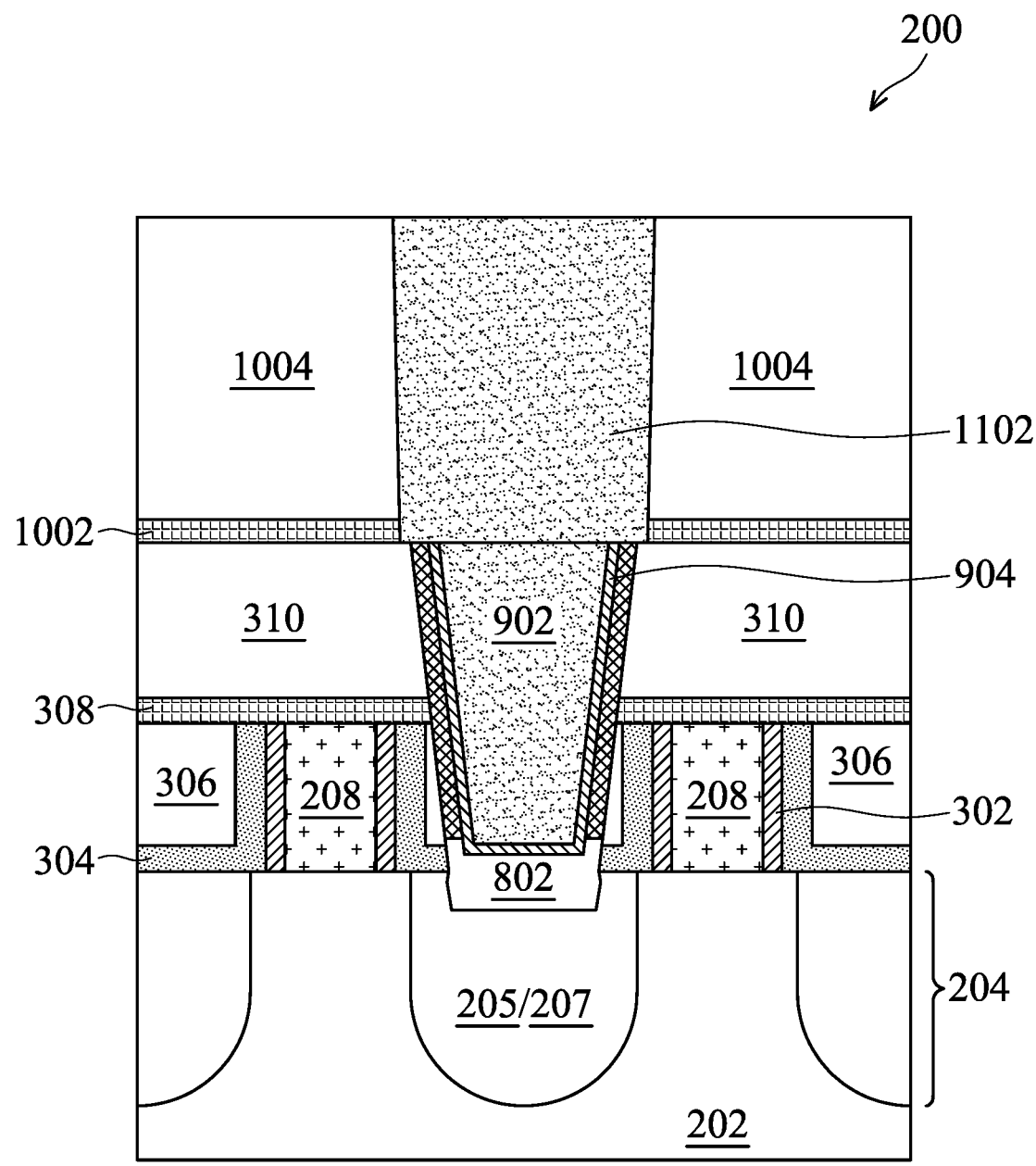

FIGS. 10 and 11 are illustrative of forming additional layers of a multilayer interconnect (MLI) including forming additional etch stop layer 1002 and ILD layer 1004 (e.g., referred to as ILD2). The ILD layer 1004 may be substantially similar to the ILD layer 306 and/or ILD layer 310 discussed above. The ILD layer 1004 may be similarly composed as ILD layers 306 and/or 310 or have a different composition. The etch stop layer 1002 may be substantially similar to as discussed above with reference to the layer 308. The layers 1002 and 308 may have similar compositions, or differing compositions.

Openings are then etched in the etch stop layer 1002 and ILD layer 1004 by suitable wet and/or dry etching for example, as defined by a lithography patterning process. The openings may define a metal interconnect feature such as a metal line, providing a horizontal routing of an electrical signal. The openings are then filled with conductive material(s) as illustrated by conductive element 1102 of FIG. 11. Conductive element 1102 may be a single layer or multi-layers. Exemplary compositions include copper, aluminum, polysilicon, and/or other suitable materials. The conductive element 1102 may be formed by deposition processes including CVD, ALD, PVD, plating, and/or other suitable methods. Additional interconnect layers may be formed over and electrically coupled to the conductive element 1102.

Referring now in particular to FIGS. 3B, 4B, and 5B illustrated therein is an illustration of an embodiment of the device 200, a device 200', which may be fabricated in a manner substantially similar in many respects as discussed above. Thus, many aspects of the description of the method 100, with respect to the device 200, also apply to the device 200'. For example, the illustrations and discussions of FIGS. 6-11 similarly apply to the device 200' with differences in source/drain configuration noted here. The differences in device 200' is that the top surface of the source/drain region 205/207 is not necessarily aligned a top of the substrate, fin or bottom of the gate structure 208. Thus, while the same method steps and features are provided, FIGS. 3B, 4B, and 5B illustrate that in an embodiment, the source/drain 205/207 is a so-called raised source/drain. The over-etch of d1 may still be provided, but that depth is defined by the original height of the source/drain region and may not be aligned with a plane of the bottom of the gate. Note that the remaining process steps are substantially similar to as discussed above. That is, that additional material (block 108 as exemplified by semiconductor material 502) is provided within the over-etch recess of the source/drain 205/207.

Thus, provided herein are methods and devices that, in some embodiments, provide for replacement of a recessed portion of the source/drain material by depositing an additional semiconductor material within a trench. The additional semiconductor material allows for consumption of the additional semiconductor material to form a silicide with less impact to the functional source/drain (e.g., less consumption of the doped source/drain to form the silicide). The methods may, as discussed above, allow for in some embodiments an improvement in the on-state resistance of the device by reducing the contact resistance.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods for reducing resistance, protecting against source/drain loss and providing source/drain contact, among others, and thereby improving device performance. In some embodiments, methods are provided, which may be used to provide form additional semiconductor material available for silicide formation over-consumption of the source/drain feature. Additional embodiments and advantages will be evident to those skilled in the art in possession of this disclosure.

Thus, one of the embodiments of the present disclosure described a method that includes providing a gate structure and a source/drain feature adjacent to the gate structure. An insulating layer or layers are formed over the source/drain feature. A trench is formed (e.g., etched) in the insulating layer to expose a surface of the source/drain feature. A semiconductor material is formed in the etched trench on the surface of the source/drain feature. The semiconductor material is then converted to a silicide.

In a further embodiment of the method, a contact metal layer is formed over the silicide filling the etched trench. In an embodiment, the semiconductor material includes forming silicon on the surface of the source/drain feature. For example, in some embodiments, the source/drain feature is epitaxially grown prior to forming the dielectric layer. In a further embodiment, the epitaxially growing the source/drain feature includes epitaxially growing silicon germanium.

In an embodiment, the method further includes forming a liner layer on sidewalls of the etched trench after forming the semiconductor material. The liner layer may be formed before converting the semiconductor material to the silicide. In an embodiment, the method also includes etching the formed liner layer. The etching the formed liner layer can remove a portion of the formed liner layer and remove a portion of the semiconductor material.

In an embodiment, the method includes etching the trench in the insulating layer by etching a recess into the source/drain feature. In a further embodiment, the semiconductor material is formed in the recess.

In another of the broader embodiments discussed herein, a method includes providing a device including a gate structure and a source/drain feature adjacent to the gate structure. An insulating layer (including insulating layers) are formed over the source/drain feature. A contact opening is etched in the insulating layer, the etching forms a recess in the source/drain feature under the contact opening. Silicon is then deposited in the recess. The silicon can then be converted to silicide. The remaining contact opening is filled with contact metal to form a contact element to the source/drain feature.

In a further embodiment, the method includes depositing the silicon by selectively depositing the silicon on an exposed surface of the recess of the source/drain feature. For example, in an embodiment, the silicon is selectively deposited by epitaxially growing the source/drain feature of at least one of silicon germanium, silicon carbide, or germanium. In an embodiment, forming the insulating layer over the source/drain feature includes forming an interlayer dielectric (ILD) layer overlying a contact etch stop layer (CESL); the ILD layer and the CESL can comprise a different dielectric composition. In an embodiment, the method includes converting the silicon to silicide by converting a portion of the source/drain feature to silicide.

In an embodiment, the silicon is deposited in the recess without purposefully doping the silicon. In an embodiment, the method includes forming a liner layer over the silicon and sidewalls of the contact opening. The liner layer is then etched to expose the silicon. Etching the liner layer also etchings a second recess in the silicon.

In another of the broader embodiments discussed herein a semiconductor device is provided. The device includes a source/drain region adjacent a gate structure on a semiconductor substrate; an insulating layer formed over the substrate and having an interface with a top surface of the source/drain region; and a contact element extending through the insulating layer to the source/drain region. The contact element further includes a silicide region having a substantially U-shape in cross-section, such that the silicide region extends above the interface; and a metal contact layer over the silicide region and within the U-shape.

In a further embodiment, the device includes the silicide region of TiSi and the source/drain region is SiGe. In an embodiment, the device further includes a liner layer disposed along a sidewall of the metal contact and interfacing a top surface of the U-shaped silicide region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a device including a gate structure and a source/drain feature adjacent to the gate structure;
forming an insulating layer over the source/drain feature;
etching a trench in the insulating layer to expose a surface of the source/drain feature;
forming a semiconductor material in the etched trench on the surface of the source/drain feature;
forming a liner layer on sidewalls of the etched trench after forming the semiconductor material; and
converting the semiconductor material to a silicide.

2. The method of claim 1, further comprising:
forming a contact metal layer over the silicide filling the etched trench.

3. The method of claim 1, wherein the forming the semiconductor material includes forming silicon on the surface of the source/drain feature.

4. The method of claim 3, further comprising:
epitaxially growing the source/drain feature prior to forming the insulating layer.

5. The method of claim 4, wherein the epitaxially growing the source/drain feature includes epitaxially growing silicon germanium.

6. The method of claim 1, wherein the forming the liner layer is performed before converting the semiconductor material to the silicide.

7. The method of claim 1, further comprising:
etching the formed liner layer, wherein the etching the formed liner layer removes a portion of the formed liner layer and removes a portion of the semiconductor material.

8. The method of claim 1, wherein the etching the trench in the insulating layer includes etching a recess into the source/drain feature.

9. The method of claim 8, wherein the forming the semiconductor material forms the semiconductor material in the recess.

10. A method, comprising:
providing a device including a gate structure and a source/drain feature adjacent to the gate structure;
forming an insulating layer over the source/drain feature;
etching a contact opening in the insulating layer, wherein the etching removes a portion of the insulating layer and a portion of the source/drain feature to form a recess in the source/drain feature under the contact opening;
after etching the contact opening in the insulating layer and the source/drain feature, depositing a silicon layer in the recess and on a top surface of the etched source/drain feature; and
converting the silicon layer to silicide and filling the contact opening with contact metal to form a contact element to the source/drain feature, wherein the converting the silicon layer to silicide includes converting a portion of the source/drain feature to silicide.

11. The method of claim 10, wherein the depositing the silicon layer includes selectively depositing the silicon layer on an exposed surface of the recess of the source/drain feature.

12. The method of claim 11, further comprising: epitaxially growing the source/drain feature of at least one of silicon germanium, silicon carbide, or germanium.

13. The method of claim 10, wherein the forming the insulating layer over the source/drain feature includes forming an interlayer dielectric (ILD) layer overlying a contact etch stop layer (CESL), wherein the ILD layer and the CESL comprise a different dielectric composition.

14. The method of claim 10, wherein the converting the silicon layer to silicide includes converting an entirety of the silicon layer to the silicide.

15. The method of claim 10, wherein the depositing the silicon layer in the recess includes not purposefully doping the silicon layer.

16. The method of claim 10, further comprising:
forming a liner layer over the silicon layer and sidewalls of the contact opening; and
etching the liner layer to expose the silicon layer, wherein the etching the liner layer also etchings a second recess in the silicon layer.

17. A method, comprising:
providing a device including a gate structure and a source/drain feature adjacent to the gate structure;
forming an insulating layer over the source/drain feature;
etching an opening in the insulating layer, wherein the opening extends into the source/drain feature;
depositing silicon in a bottom portion of the opening;
forming a liner layer along sidewalls of the opening and over at least a portion of the deposited silicon;
converting the silicon to silicide; and
depositing a metal layer in a top portion of the opening to form a contact element to the source/drain feature.

18. The method of claim 17, wherein the providing the device including the source/drain feature includes: growing a raised source/drain feature extending above a top surface of a semiconductor substrate.

19. The method of claim 17, wherein after the converting the silicon to silicide, a portion of the silicide interfaces the liner layer.

20. The method of claim 17, wherein the depositing silicon includes epitaxially growing undoped silicon.

* * * * *